(12) United States Patent
Oono et al.

(10) Patent No.: US 7,862,289 B2
(45) Date of Patent: *Jan. 4, 2011

(54) VACUUM PROCESSING APPARATUS AND VACUUM PROCESSING METHOD

(75) Inventors: Takeshi Oono, Kudamatsu (JP); Kenji Nakata, Hikari (JP); Shoji Okiguchi, Kudamatsu (JP); Tooru Ueno, Shunan (JP); Hidehiro Oomae, Hikari (JP); Shigeharu Minami, Kudamatsu (JP); Yoshitaka Kai, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 76 days.

This patent is subject to a terminal disclaimer.

(21) Appl. No.: 12/230,467

(22) Filed: Aug. 29, 2008

(65) Prior Publication Data

US 2009/0003978 A1  Jan. 1, 2009

Related U.S. Application Data

(63) Continuation of application No. 10/874,241, filed on Jun. 24, 2004, now Pat. No. 7,476,073.

(30) Foreign Application Priority Data

Mar. 30, 2004  (JP) .............................. 2004-097774

(51) Int. Cl.
*B65H 85/00* (2006.01)
(52) U.S. Cl. .................................................... 414/806
(58) Field of Classification Search ................. 414/217, 414/411, 806, 805, 810
See application file for complete search history.

(56) References Cited

U.S. PATENT DOCUMENTS 5,292,393 A * 3/1994 Maydan et al. ......... 156/345.32
6,257,827 B1 * 7/2001 Hendrickson et al. ....... 414/805
6,446,353 B2   9/2002 Kato
6,451,118 B1   9/2002 Garriga
6,510,365 B1   1/2003 Nishinakayama
6,811,369 B2  11/2004 Yamada
6,852,194 B2 * 2/2005 Matsushita et al. ..... 156/345.32
7,476,073 B2 * 1/2009 Oono et al. ................. 414/810
2002/0051698 A1 5/2002 Birkner
2003/0023343 A1 1/2003 Tomita

FOREIGN PATENT DOCUMENTS

| JP | 62-216315   | 9/1987  |
| JP | 11-330037   | 11/1999 |
| JP | 2000-216211 | 8/2000  |
| JP | 2001-093791 | 4/2001  |
| JP | 2003-115518 | 4/2003  |

* cited by examiner

*Primary Examiner*—Charles A Fox
(74) *Attorney, Agent, or Firm*—Antonelli, Terry, Stout & Kraus, LLP.

(57) ABSTRACT

A vacuum processing apparatus and method in which the apparatus includes vacuum processing chambers for subjecting a sample to vacuum processing, a vacuum carriage, a switchable chamber, a cassette support for supporting a plurality of cassettes capable of housing samples, and a waiting cassette support for supporting a waiting cassette that differs from the cassettes supported on the cassette support and capable of having a number of samples. An atmospheric carriage enables carrying a sample among a given cassette of the plurality of cassettes or the waiting cassette. A controller effects control for carrying unprocessed and processed samples among the given cassette, the waiting cassette and the vacuum processing chamber, so that a mixture of both processed and unprocessed samples does not exist in the given cassette or the waiting cassette.

1 Claim, 1 Drawing Sheet

VACUUM PROCESSING APPARATUS AND VACUUM PROCESSING METHOD

This application is a continuation of U.S. application Ser. No. 10/874,241, filed Jun. 24, 2004, now U.S. Pat. No. 7,476,073, the contents of which are incorporated herein by reference.

The present application claims priority from Japanese patent application No. 2004-097774 filed on Mar. 30, 2004, the content of which is hereby incorporated by reference into this application.

FIELD OF THE INVENTION

The present invention relates to a vacuum processing apparatus and vacuum processing method equipped with plural vacuum processing chambers, and more specifically, to the improvement of yield factor and operating rate of the vacuum processing apparatus and method that use corrosive gas such as halogen gas.

DESCRIPTION OF THE RELATED ART

Heretofore, the operating rate of a vacuum processing apparatus using at least two sets of processing devices was enhanced by utilizing the processing chambers that are operating normally as the processing path when any of the processing chambers is out of order due to malfunction etc. during operation (refer for example to patent document 1).

In an apparatus having a post-processing chamber or where the etched wafer carried out of the processing chamber is released directly to atmosphere, the wafer was subjected to ashing treatment or heating treatment, but there was no sufficient consideration on how to enhance the yield factor of the apparatus by reducing the residual gas on the surface of the wafer. If the processing of a specific device did not allow ashing treatment or heating treatment to be performed, the device had to be carried out of the chamber without being subjected to such treatment. The residual gas on the surface of the processed wafer being stored in a carrier such as a FOUP (front opening unified pod) after etching causes foreign matter to be attached to the unprocessed wafer, and the foreign matter considered to be caused by halogen gas on the wafer act as mask during etching treatment, which may cause etching residue or the like that deteriorate the yield factor. Furthermore, since the residual gas could not be removed completely, the increase of residual gas concentration in the FOUP or other carriers affecting the surrounding environment has become a problem.

There has been proposed a batch vacuum processing system adopting a third cassette disposed along the path of carriage of the wafers that enables the wafers to be returned to its original position in the cassette (refer for example to patent document 2). However, there is no disclosure of an art that prevents mixture of the unprocessed samples and processed samples by putting either the unprocessed or processed samples in waiting.

Patent Document 1:
  Japanese Patent Application Laid-Open No. 2001-93791

Patent Document 2:
  Japanese Patent Application Laid-Open No. 62-216315

According to the prior art, the processed wafers (processed samples) and the unprocessed wafers (unprocessed samples) were stored in a mixture in a single carrier such as a FOUP, which caused deterioration of the yield factor of the product due to the foreign matter or the like derived from the processed wafers. The object of the present invention is to provide a vacuum processing apparatus and vacuum processing method capable of improving the yield factor of the product.

SUMMARY OF THE INVENTION

In order to achieve the above object, the present invention adopts a waiting station to be disposed within an atmospheric carriage unit for preventing the unprocessed wafers from being mixed with the processed wafers in a single carrier. The term "waiting station" is used as a generic term including a waiting cassette disposed in atmosphere and a waiting chamber disposed in vacuum. Further, the waiting station can be equipped with a purging system for enhancing the substitution of the residual containing gas derived from the processed wafers. Moreover, the unprocessed wafers can be carried into the waiting station while the processed wafers are carried to the original carrier.

Moreover, the present invention optimizes carriage sequence for reducing the effect to the throughput caused by the addition of the waiting station.

The present invention provides a vacuum processing apparatus comprising a plurality of vacuum processing chambers for subjecting a sample to vacuum processing, a vacuum carriage means for carrying the sample into and out of the vacuum processing chamber, a switchable chamber capable of being switched between atmosphere and vacuum for carrying the sample into and out of the vacuum processing chamber, a cassette supporting means for supporting a plurality of cassettes capable of housing samples, a carriage means capable of moving vertically for taking out a sample from a given cassette on the cassette supporting means, a control means performing carriage control for carrying the sample taken out of the given cassette via the carriage means, the switchable chamber and the vacuum carriage means into the vacuum processing chamber, and for carrying the processed sample out of the vacuum processing chamber, and a waiting cassette supporting means capable of supporting a waiting cassette for preventing the processed sample from being mixed with the unprocessed sample.

According further to the above vacuum processing apparatus of the present invention, the waiting cassette supporting means is disposed in atmosphere and capable of supporting the waiting cassette for housing the processed sample to be put in waiting. According to the vacuum processing apparatus of the present invention, the waiting cassette supporting means is disposed in atmosphere and capable of supporting the waiting cassette for housing the unprocessed sample to be put in waiting.

According to the vacuum processing apparatus of the present invention, the waiting cassette supporting means is disposed in vacuum and equipped with a waiting chamber for housing the processed sample to be put in waiting.

According to the vacuum processing apparatus of the present invention, the waiting cassette supporting means is capable of supporting a waiting cassette for housing either the processed sample or the unprocessed sample to be put in waiting until all the unprocessed samples are carried out of the given cassette.

According further to the present vacuum processing apparatus, the waiting cassette supporting means is disposed in atmosphere and capable of being moved either vertically or horizontally.

According to another aspect of the invention for solving the above-mentioned problems, the invention provides a vacuum processing method comprising the steps of taking out a sample from a given cassette placed on a cassette supporting means, carrying the sample into a vacuum processing chamber via a chamber capable of being switched between atmosphere and vacuum, and subjecting the sample to vacuum processing, characterized in subjecting the sample to vacuum processing with either the unprocessed sample or the processed sample put in waiting in a waiting cassette.

According to the above-mentioned vacuum processing method of the present invention, the vacuum processing of the sample is performed with the processed sample put in waiting in the waiting cassette disposed in atmosphere. According to another aspect of the present vacuum processing method, the vacuum processing of the sample is performed with the unprocessed sample put in waiting in the waiting cassette disposed in atmosphere.

According further to the vacuum processing method of the present invention, the vacuum processing of the sample is performed with the processed sample put in waiting in a waiting chamber disposed in vacuum.

According further to the vacuum processing method of the present invention, the vacuum processing of the sample is performed with either the processed sample or the unprocessed sample put in waiting until all the unprocessed samples are carried out of the given cassette.

As explained, the present invention provides a method and apparatus for reducing the deterioration of yield factor without reducing the operating rate by preventing the unprocessed wafers and the processed wafers from being mixed in atmosphere.

DETAILED DESCRIPTION OF THE PREFERRED EMBODIMENT

Figure 1:
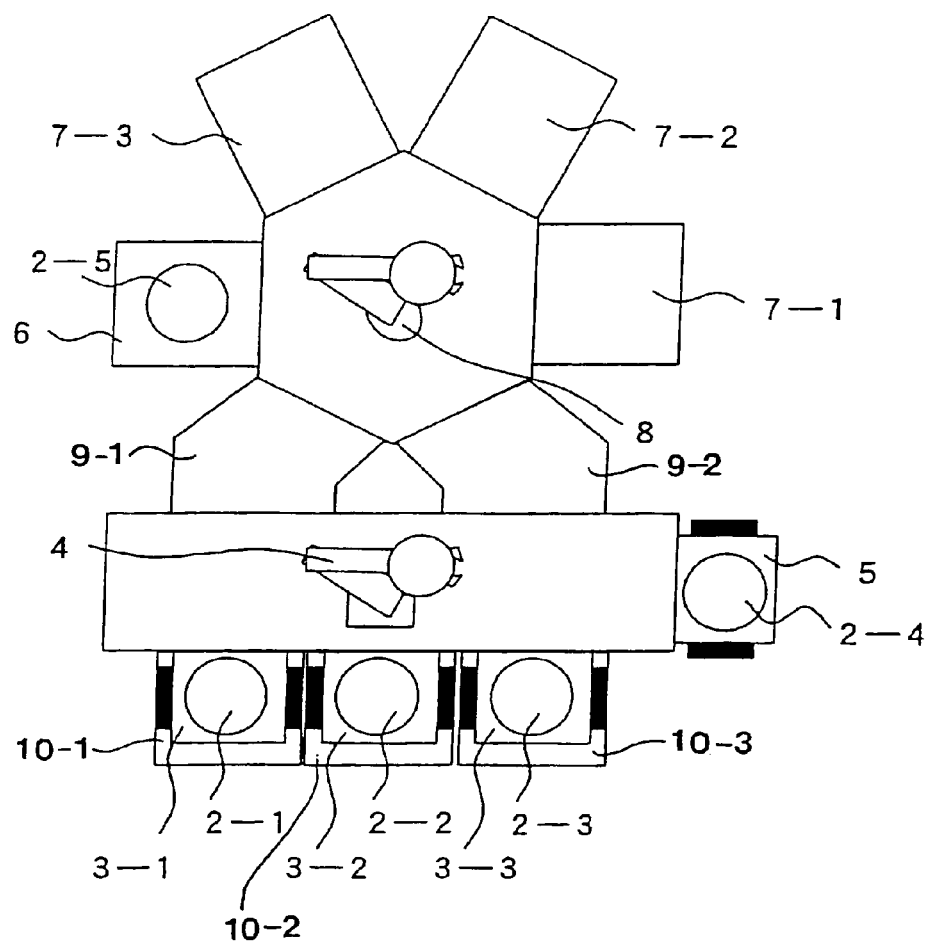
FIG. 1 is a view showing the construction of the vacuum processing apparatus.

Now, the preferred embodiments of the present invention will be described. FIG. 1 shows the structure of the apparatus according to the present invention. A vacuum processing apparatus 1 comprises a plurality of vacuum processing chambers 7-1, 7-2, 7-3, hereinafter generally referred to as vacuum processing chamber 7, for subjecting samples 2-1, 2-2, 2-3, 2-4, 2-5, hereinafter generally referred to as sample 2, to vacuum processing, a vacuum carriage means 8 for carrying samples 2 into and out of the vacuum processing chambers 7, switchable chambers 9-1, 9-2, hereinafter generally referred to as switchable chamber 9, that can be switched between atmosphere and vacuum for carrying samples 2 into and out of the vacuum processing chamber 7, cassette supporting means 10-1, 10-2, 10-3, hereinafter generally referred to as cassette supporting means 10, for supporting plural cassettes 3-1, 3-2, 3-3, hereinafter generally referred to as cassette 3, capable of housing samples 2, a carriage means 4 capable of moving vertically and taking out a sample 2 from a given cassette on the cassette supporting means, a control unit performing carriage control for carrying the sample 2 stored in the given cassette via the carriage means 4, the switchable chamber 9 and the vacuum carriage means 8 into the vacuum processing chamber 7 and for carrying the processed sample out of the vacuum processing chamber, a waiting cassette 5 disposed newly according to the present invention in the atmosphere for temporarily storing the unprocessed sample or the processed sample to be put in waiting, and a waiting chamber 6 for temporarily storing the processed sample in vacuum. The number of hands equipped to the vacuum carriage means 8 and the atmospheric carriage means 4 is not limited to one.

According to a first embodiment of the invention, a first sample 2-1 taken out of cassette 3-1 by the carriage means 4 disposed in atmosphere is carried via the switchable chamber 9-1 and the vacuum carriage means 8 into the vacuum processing chamber 7-1, and there the sample is subjected to an etching process. In an example where the plural vacuum processing chambers 7 are operated to perform processing according to the same recipe in a continuous manner, a second sample 2-1 is subsequently carried via the carriage means to the vacuum processing chamber 7-2 for continuous processing thereof, and subjected to etching process. Similarly, a third sample 2-1 is subjected to etching process in the vacuum processing chamber 7-3. Thereafter, all the unprocessed samples left in the cassette 3-1 are sequentially carried via the carriage means 4 into the waiting cassette 5 disposed in the atmosphere, starting from the n-th cassette and sequentially in descending order thereof if the number of samples housed in the cassette is n. When all the unprocessed samples are removed from cassette 3-1, the processed samples 2-1 in the vacuum processing chamber 7-1 are returned to the cassette 3-1, and thus, the unprocessed samples and processed samples are prevented from being stored in mixture in a single cassette.

The waiting cassette 5 desirably has a capacity to store not less than n-m samples, if the number of vacuum processing chambers operated according to the above-described operation is m. For example, if two cassettes are continuously processable in the process for manufacturing products, the waiting cassette is designed to have a capacity to store samples from plural cassettes, and is capable of moving in the vertical or horizontal direction. If the waiting cassette 5 is disposed within the range of movement of the carriage means (atmospheric robot) 4, the cassette can be in a fixed state and the movement mechanism can be omitted. According to some processing operations, the carriage control can be performed without deteriorating throughput by starting processing of a first processable sample without storing the first sample in the waiting cassette.

In other words, according to the present embodiment, the vacuum processing apparatus is equipped with plural vacuum processing chambers for subjecting samples to vacuum processing, a vacuum carriage means for carrying samples into and out of the vacuum processing chamber, a switchable chamber capable of being switched between atmosphere and vacuum for carrying samples into and out of the vacuum processing chamber, a cassette supporting means for supporting plural cassettes capable of housing samples, a carriage means capable of moving in the vertical direction and taking out samples from a given cassette on the cassette supporting means, and a control means performing carriage control for carrying the sample stored in the given cassette via the carriage means, the switchable chamber and the vacuum carriage means into the vacuum processing chamber and for carrying the processed sample processed in the vacuum processing chamber out of the chamber, wherein the vacuum processing apparatus is further equipped with a waiting cassette supporting means for supporting a waiting cassette that prevents the processed samples and the unprocessed samples from being mixed. The waiting cassette supporting means disposed in the atmosphere is capable of supporting the waiting cassette for storing the unprocessed samples to be put in waiting.

According to embodiment 1, the unprocessed samples were stored temporarily in the waiting cassette, but the present invention is not limited to such example. According to embodiment 2, the unprocessed samples 2 stored in the cassette 3 are carried to the vacuum processing chamber 7 sequentially in order and subjected to processing. The samples having been processed in the vacuum processing chamber are temporarily stored in the waiting cassette 5. Then, when the carriage control determines that all the unprocessed samples in the cassette 3 have been carried out, the processed samples are carried out of the waiting cassette and returned to the original cassette 3. In this case, throughput will not be deteriorated if the samples are started to be carried out when it is determined that all the unprocessed samples have been carried out of the cassette 3, and not waiting until all the processed samples are housed in the waiting cassette 5. In other words, according to the present embodiment, and therefore, according to the present invention, the waiting cassette supporting means disposed in the atmosphere is capable of supporting a waiting cassette housing the processed samples to be put in waiting.

In order to reduce the reaction of any residual corrosive gas adhered to the processed sample with moisture etc. in the atmosphere that may affect the ambient surroundings, it is preferable to provide a purging mechanism for performing inert gas replacement of the waiting cassette 5. The purging mechanism introducing inert gas into the waiting cassette from the exterior or from above the waiting cassette will effectively improve the environmental atmosphere inside the cassette. Further, an exhaust mechanism can be provided to the lower area of the waiting cassette. Moreover, a door can be disposed on the waiting cassette 5 that is closed when the carriage means 4 is not operated with respect to the waiting cassette 5, so as to achieve more effective results by the inert gas replacement.

Embodiment 3 is an example adopting a waiting chamber 6 disposed in vacuum. After processing the sample 2 taken out of the cassette 3 in the vacuum processing chamber 7, the processed sample 2 is temporarily stored in the waiting chamber 6. Similar to embodiment 2, the present embodiment is equipped with a carriage means capable of determining that all the unprocessed samples have been taken out of the cassette 3, and the samples in the waiting chamber 6 are sequentially carried back to the original cassette 3. By providing a waiting chamber in vacuum, the sample is prevented from having its surface exposed to the atmosphere, so the affect of corrosion or other causes that may deteriorate the yield factor can be reduced.

In other words, according to the present embodiment, a waiting cassette supporting means is disposed in vacuum and equipped with awaiting chamber for storing the processed samples to be put in waiting.

According to the embodiments described above, the vacuum processing apparatus is equipped with a waiting cassette supporting means capable of supporting a waiting cassette housing either processed samples or unprocessed samples to be put in waiting until lot processing is completed.

Furthermore, according to the vacuum processing apparatus, the waiting cassette supporting means is disposed in atmosphere, and capable of being moved either vertically or horizontally. Thus, if the unprocessed samples are taken out from plural cassettes, the processed or unprocessed samples can be sorted and stored in the waiting cassette based on the cassettes that the samples were originally taken from.

In each of the above-mentioned embodiments, the apparatus was equipped with either a waiting cassette 5 disposed in atmosphere or a waiting chamber 6 disposed in vacuum, but the apparatus can be equipped with both.

As explained, according to the present invention, the deterioration of yield factor caused for example by corrosion can be reduced without deteriorating the operation efficiency, by preventing the unprocessed samples and the processed samples from being mixed in atmosphere.

What is claimed is:

1. A vacuum processing method comprising:

taking out an unprocessed sample from a given cassette supported on a cassette supporting means;

carrying the unprocessed sample into one of a plurality of vacuum processing chambers via a switchable chamber capable of being switched between atmosphere and vacuum;

subjecting the unprocessed sample to vacuum processing; and carrying the processed sample into the given cassette;

wherein while subjecting the sample taken out of the given cassette to processing, only either a sequence (A) of an unprocessed sample in the given cassette or a sequence (B) of a processed sample processed in the vacuum processing chamber is put in waiting in a waiting cassette supported on a waiting cassette supporting means disposed in atmosphere, so that the sample is carried in a state where the processed sample and the unprocessed sample are not mixed in the given cassette; and (1) wherein if the sequence (B) is chosen then the processed sample taken out of the given cassette and subjected to vacuum processing is put in waiting in the waiting cassette, and the processed sample is returned from the waiting cassette to the given cassette in a state where no unprocessed sample exists in the given cassette; or (2) wherein if the sequence (A) is chosen then an unprocessed sample is taken out of the given cassette and carried into one of the vacuum processing chambers, an unprocessed sample remaining in the given cassette is taken out and put in waiting in the waiting cassette, the unprocessed sample taken out of the given cassette or the waiting cassette is subjected to vacuum processing, and the processed sample is returned to the given cassette in a state where no unprocessed sample exists in the given cassette.

* * * * *